United States Patent [19]

Götze et al.

[11] 4,450,561

[45] May 22, 1984

[54] METHOD AND DEVICE FOR GENERATING CHECK BITS PROTECTING A DATA WORD

[75] Inventors: Volkmar Götze, Grafenau; Günther Potz, Sindelfingen, both of Fed. Rep. of Germany

[73] Assignee: International Business Machines Corporation, Armonk, N.Y.

[21] Appl. No.: 358,737

[22] Filed: Mar. 16, 1982

[30] Foreign Application Priority Data

Jun. 5, 1981 [DE] Fed. Rep. of Germany ....... 3122381

[51] Int. Cl.³ ............................................. G06F 11/10
[52] U.S. Cl. ................................................... 371/37
[58] Field of Search ........................ 371/37, 38, 39, 40

[56] References Cited

U.S. PATENT DOCUMENTS

| | | | |
|---|---|---|---|
| 4,160,236 | 7/1979 | Oka et al. | 371/37 |
| 4,312,068 | 1/1982 | Goss et al. | 371/37 |

OTHER PUBLICATIONS

Ross, Parallel Cyclic Redundancy Check Using Programmable Logic Array, IBM Technical Disclosure Bulletin, vol. 19, No. 8, Jan. 1977, pp. 3068–3070.

*Primary Examiner*—Charles E. Atkinson
*Attorney, Agent, or Firm*—James E. Murray

[57] ABSTRACT

Each of the check bits of an ECC codeword is generated in parallel in a byte serial sequence to permit structuring of the ECC device so that it has general application. For this purpose a byte wide check bit generator is provided for each of the check bits. These check bit generators contain generalized gating logic controlled by stored data that is capable of passing any combination of the bits making up the byte. As each byte enters such a check bit generator, the data controlling the gating logic is changed to generate a partial sum of the check bit using only those data bits from that data byte designated by the H matrix on the ECC. The partial check bits are then accumulated modulo 2 to generate the check bit to be stored with the data bits.

12 Claims, 6 Drawing Figures

FIG. 3

72/64 ECC CODE

FIG. 6

CODE ROS/RAM

FIG. 5

| INPUT INFO. | MPX 1 LEVEL | MPX 1 OUTPUT | CRL SIGNALS | BPG INPUT | | | | | | | | | LT 1 Σ MOD 2 | LT 1 OUT | CLOCK |
|---|---|---|---|---|---|---|---|---|---|---|---|---|---|---|---|
| WRITE EIGHT ZEROS AND D0 – D63 | 0 | D0 – D7 | 11111111 | D0 | D1 | D2 | D3 | D4 | D5 | D6 | D7 | | 0 | | T0 |
| | 1 | D8 – D15 | 11111111 | D8 | D9 | D10 | D11 | D12 | D13 | D14 | D15 | | 0, P0; Σ = P0 | | T1 |
| | 2 | D16 – D23 | 00000000 | 0 | 0 | 0 | 0 | 0 | 0 | 0 | 0 | | P0, P1 | | T2 |
| | 3 | D24 – D31 | 00000000 | 0 | 0 | 0 | 0 | 0 | 0 | 0 | 0 | | P0 – P2 | | T3 |
| | 4 | D32 – D39 | 10001110 | D32 | 0 | 0 | 0 | D36 | D37 | D38 | 0 | | P0 – P3 | | T4 |
| | 5 | D40 – D47 | 10001110 | D40 | 0 | 0 | 0 | D44 | D45 | D46 | 0 | | P0 – P4 | | T5 |
| | 6 | D48 – D55 | 10001110 | D48 | 0 | 0 | 0 | D52 | D53 | D54 | 0 | | P0 – P5 | C1 | T6 |
| | 7 | D56 – D63 | 10001110 | D56 | 0 | 0 | 0 | D60 | D61 | D62 | 0 | | P0 – P6 | | T7 |
| | | | | | | | | | | | | | P0 – P7 | | T8 |
| READ C1'–C8' AND D0 – D63 | 0 | D0 – D7 | 11111111 | D0 | D1 | D2 | D3 | D4 | D5 | D6 | D7 | | C1' | | T0 |
| | 1 | D8 – D15 | 11111111 | D8 | D9 | D10 | D11 | D12 | D13 | D14 | D15 | | C1', P0'; Σ = P0' | | T1 |
| | 2 | D16 – D23 | 00000000 | 0 | 0 | 0 | 0 | 0 | 0 | 0 | 0 | | P0', P1' | | T2 |
| | 3 | D24 – D31 | 00000000 | 0 | 0 | 0 | 0 | 0 | 0 | 0 | 0 | | P0' – P2' | | T3 |
| | 4 | D32 – D39 | 10001110 | D32 | 0 | 0 | 0 | D36 | D37 | D38 | 0 | | P0' – P3' | | T4 |
| | 5 | D40 – D47 | 10001110 | D40 | 0 | 0 | 0 | D44 | D45 | D46 | 0 | | P0' – P4' | | T5 |
| | 6 | D48 – D55 | 10001110 | D48 | 0 | 0 | 0 | D52 | D53 | D54 | 0 | | P0' – P5' | S1 | T6 |
| | 7 | D56 – D63 | 10001110 | D56 | 0 | 0 | 0 | D60 | D61 | D62 | 0 | | P0' – P6' | | T7 |
| | | | | | | | | | | | | | P0' – P7' | | T8 |

METHOD AND DEVICE FOR GENERATING CHECK BITS PROTECTING A DATA WORD

BACKGROUND OF THE INVENTION

The present invention relates to the implementation of error correction codes and more particularly to an implementation of error correcting codes which can be used for a plurality of applications.

Check bits are used e.g. for protecting data words against errors in data processing systems. When the data word is read into the storage of the system, check bits are generated in accordance with a predetermined code rule, and stored in the storage together with the data word. When the data word is read out, check bits for the read-out data word are again generated and compared with the originally stored check bits. The comparison of corresponding check bits supplies the so-called syndrome bits. If all syndrome bits are zero, the data word read corresponds to the one that has been written in. If one or several syndrome bits are not zero, there is an error, and depending on the code used one or several errors can be detected, and a limited number of errors can be corrected, by decoding the syndrome bit pattern. Devices for error detection and correction of the above specified type are described in U.S. Pat. Nos. 3,623,155, 3,648,239 and 3,755,797.

Whether the data bits arrive serially or in parallel usually determine whether the check bits are generated serially or in parallel, too. Depending on the type of reading device, the check bits can be generated in a byte-serial mode (see U.S. Pat. Nos. 3,851,306 and 3,868,632).

Once an ECC device is designed for a specific application it usually can only be used with one specific code, and is only applicable either for serial or for parallel operation. Furthermore, they are usually designed for use only for a specific number of bytes in the data word, and the number of bits per byte. Thus, an existing ECC device implemented on a semiconductor chip generally cannot be adapted to different circumstances so that a new ECC chip will have to be developed for each new circumstance.

It is therefore the object of the present invention to provide a device for generating check bits in such a manner that it can be applied universally.

BRIEF DESCRIPTION OF THE INVENTION

In accordance with the present invention each of the check bits of a ECC codeword is generated in parallel in a byte serial sequence to permit a structuring of the ECC device so that it has general application. For this purpose a byte wide check bit generator is provided for each of the check bits. These check bit generators contain generalized gating logic controlled by stored data that is capable of passing any combination of the bits making up the byte. As each byte enters such a check bit generator, the data controlling the gating logic is changed to generate a partial sum of the check bit using only those data bits from that data byte designated by the H matrix on the ECC. The partial check bits are then accumulated modulo 2 to generate the check bit to be stored with the data bits.

In this arrangement, the code bit generators are not code-dependent but are standardized units. The same is true of the circuits for the byte-serial feeding of the data bytes to the check bit generators. In addition, the accumulation device does not depend on the code either. This leaves only the stored data that selects the data bits used in the check bit generators which is code dependent. This data can be stored in a programmable read-only storage (ROS, ROM). For such a programmable read-only storage (PROM, EAROM, EEROM, etc.) numerous forms of implementation are known. Programmable logic arrays (PLA) are possible too.

Since according to the invention the check bit generation is effected in a byte-serial mode, there is a certain disadvantage as to speed compared with the fully parallel devices, but for many used, such as in printers or display terminals this is of no importance. Compared with a fully serial device operating with shift registers, the speed according to the present invention is much improved. Of course, the amount of cost and hardware required is much lower than in the fully parallel devices mostly consisting of complex Exclusive-OR trees.

Particularly the possible use in peripherals, as e.g. in the above-mentioned printers or display terminals shows that the invention offers a protection of the data to be transferred to these devices as realized up to now only in connection with storages of a data processing system. Developing a ECC device suitable for a printer has always taken too much time, so that in such peripherals the data words could be protected through simple parity bits only. However, this permits the detection but not the correction of a single error. With the invention, a very rapid adaptation of the ECC device to the respective purpose can be effected, with the consequence that the few components of the device as disclosed by the invention which depend on the code or on the width of the transfer paths, can be quickly initialized. An entirely novel development of an ECC semiconductor chip, and the production of this chip for respectively different purposes has been rendered superfluous by the present invention.

THE DRAWINGS

An embodiment of the invention will now be described with reference to the drawings, which show the following:

FIG. 3 is a code matrix;

FIG. 5 is details of the time control of the arrangement in accordance with FIG. 4;

Fig. 6 is a survey of bit selection signals.

DETAILED EMBODIMENT

Figure 1:
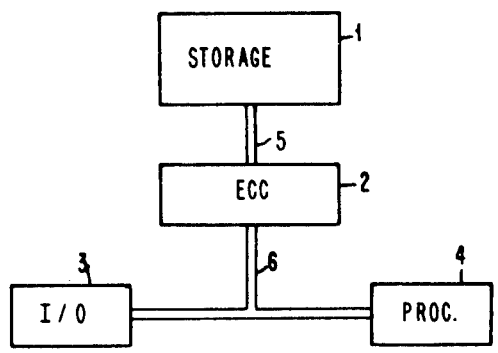
FIG. 1 is the basic structure of an error correcting device connected to a storage.

It will first be shown with reference to FIG. 1 how an error correcting device (ECC device) 2 is connected to a storage 1 for the writing-in and reading-out of data. Upon writing in, check bits are generated in device 2 for data supplied by a peripheral unit 3 or by a processor 4 via a bus 6. Together with the respective data, these check bits are read into storage 1 via bus 5. Upon the read-out, device 2 once more generates check bits for the read-out data according to the same rule, and these check bits are compared with the stored check bits. The comparison of two corresponding check bits results in the so-called syndrome bit. If all syndrome bits are 0 it can be assumed that the read-out data are identical with the previously read-in data, i.e. that the data have not been adversely affected on bus 5 or in storage 1. If one or several syndrome bits are not 0, this indicates a single error or a double error depending on the encoding rule selected for generating the check bits. Most ECC devices are structured in such a manner that single errors can be corrected. If there is a single error, it can be localized and corrected through the decoding of the syndrome bit pattern. Subsequently, the corrected data are emitted to the addressed unit via bus 6.

The structure of the ECC devices depends on the number of data bits in a data work, i.e. on the width of the transfer buses 5 and 6, and it is furthermore influenced by the fact whether storage 1 is word-organized, halfword-organized or byte-organized. ECC device 2 can be structurally combined with units 1, 3, or 4.

Figure 2:
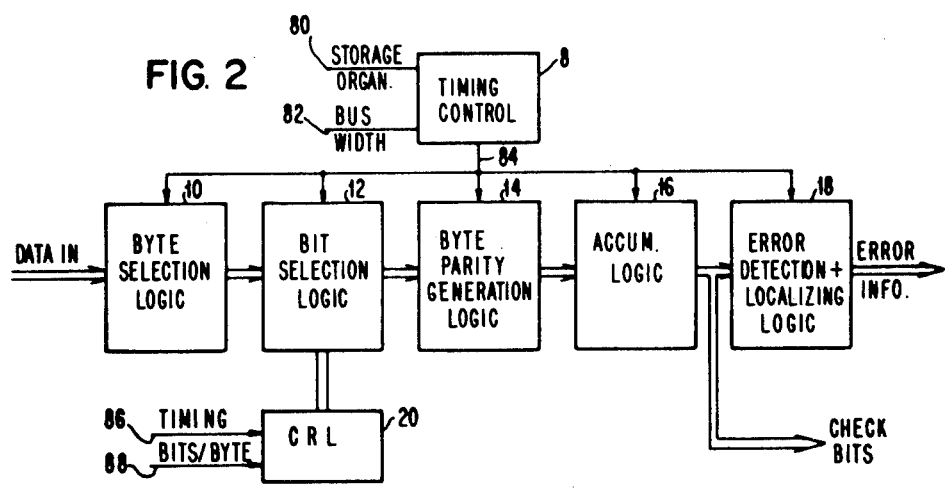
FIG. 2 is the basic circuit arrangement of an embodiment of the invention.
Figures 3, 6:
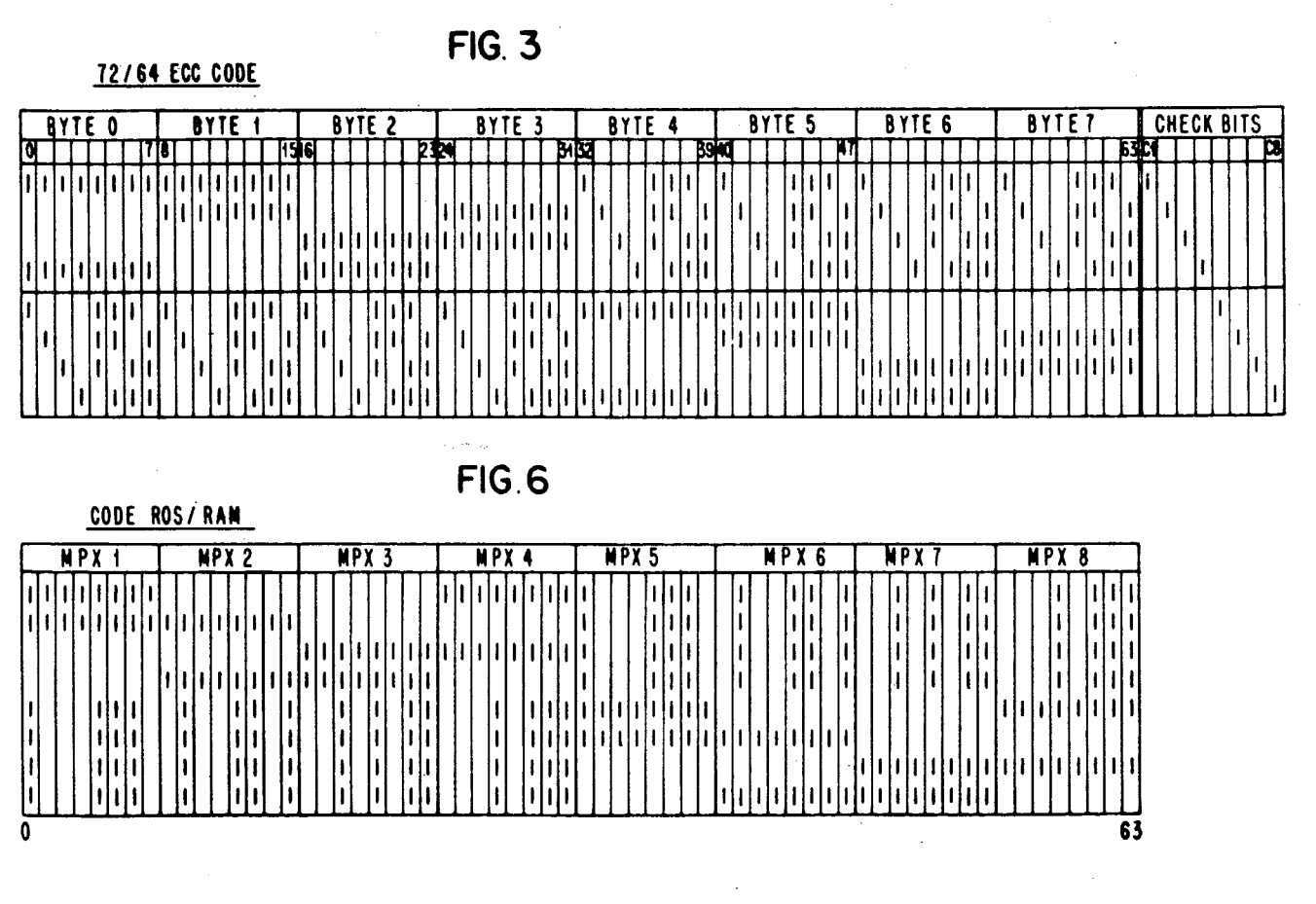

FIG. 2 represents a basic circuit arrangement of an embodiment of the present invention. The data to be encoded or checked are applied to a byte selection logic 10. According to the invention, the check bits are generated byte-wise, as will be described below in detail in connection with FIGS. 3 and 4. For better understanding of the generation of check bits, reference is now made to FIG. 3 showing a code matrix, also called "H-matrix". In the present case, the data word is to comprise eight data bytes having eight data bits each. To this data word, a check byte is generated, i.e. eight check bits C1-C8 are produced. To give an example: Check bit C1 is generated by an addition modulo 2 of all data bits given with a dash in the first line of the matrix according to FIG. 3. Since in the present case the overall number of the bits per storage location in storage 1 is 72, and since 64 bits thereof are data bits D0-D63, the present code will be called a 72/64 code. As demonstrated by row 1 of the matrix a total of 32 data bits are used for generating check bit C1, i.e. bits 0-15, 32, 36-38, 40, 44-46, 48, 52-54, 56, and 60-62. Therefore, check bit C1 could be generated by an Exclusive-OR gate having 32 inputs, or through a modulo 2 adder to which the respective 32 bits are applied successively. The invention makes a new approach in that parity bits are successively generated to the individual data bytes, and in that these byte parities are accumulated in the modulo 2 mode. The accumulation results will then correspond to a parity bit over the respective data bits of the eight data bytes, i.e. in the above example over the 32 data bits mentioned. FIG. 2 provides for this purpose byte selection logic 10 which from the read-in data word successively selects the individual data bytes for the generation of the check bit. In accordance with the data bits marked in the matrix of FIG. 3, a following bit selection logic 12 selects for each data byte those data bits which are to be used for generating the check bit. For the remaining bits of the byte zeros are passed on. The given byte parity bit is generated by byte parity generation logic 14 depicted in FIG. 2. The individual byte parities are summed up modulo 2 in the subsequent accumulation logic 16. At the output of logic 16 therefore check bits C1-C8 are available. If in a read operation the check bits to the read-out data are once more generated and compared with the equally read-out check bits, accumulation logic 16 supplies syndrome bits S1-S8 in the manner described below. An error detecting and localizing logic 18 supplies the required error data by decoding the syndrome bits. The syndrome bit decoding unit in logic 18 depends of course on the code used. However, as this code is altered only rarely, a read-only storage can e.g. be used for logic 18. Similarly, the data bits used for generating a check bit can be selected by means of a code implementation logic 20 for which a read-only storage can be employed, too.

For the time control of the device a clock control 8 is provided. However, this time control strongly depends on the amount of data bytes provided in a data word, and on the type of storage organization. The corresponding control signals representing the storage organization and the bus width are thus to be applied to clock control 8 as control signals. Via a line 80 the storage organization is entered, i.e. the number of bytes per storage location (generally 1, 2, 4 or 8 bytes). It is thus taken into account for how many bytes per storage operation check bits will have to be generated.

Via line 82 control signals are entered which define the width of the buses (serially, or 1, 2, 4, 8 bytes) connected to the ECC device 2. The width of bus 5 generally corresponds to the capacity of a storage location.

Furthermore, code implementing logic 20 receives via lines 86 and 88 control signals which define the number of required clock signals depending on the number of bytes, and the number of data bits per data byte.

For controlling the other functional units 10-18 of FIG. 2, clock control 8 is connected to these units via a control bus 84.

Figure 4:
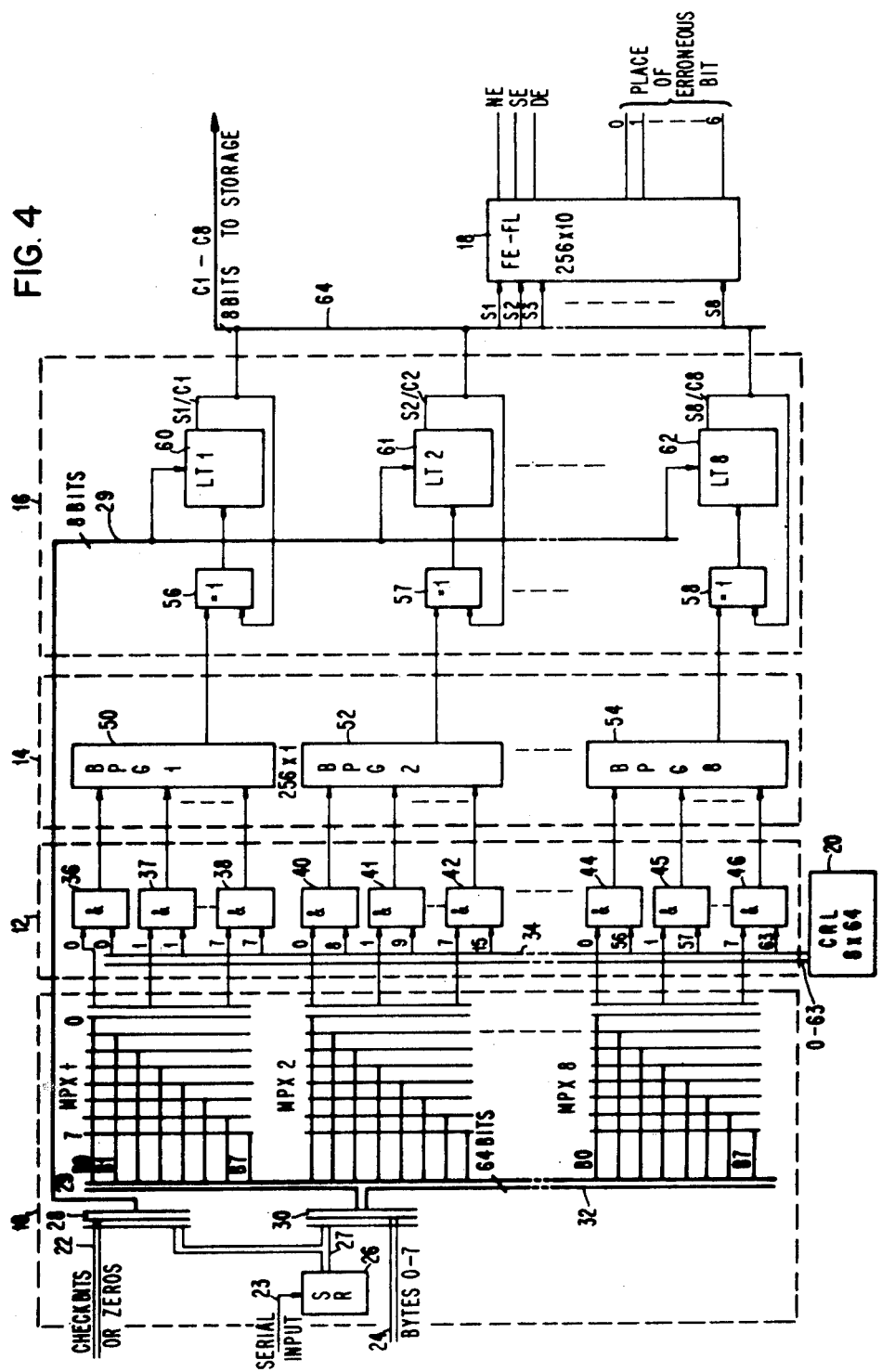
FIG. 4 is a detailed representation of the circuit arrangement depicted in FIG. 2.

FIG. 4 is a detailed representation of the basic circuit arrangement of FIG. 2. The left side of the Figure shows the various data inputs. Serially arriving data bits are read via line 23 into a shift register 26 for serial-parallel conversion. Data arriving in parallel are read into bus 32 via bus 24 and gating circuit 30. With a maximum word length of 64 data bits, this bus 32 has a width of 64 bits, too. Via bus 27 and gating circuit 30, shift register 26 can also be connected to bus 32. In a read operation, i.e. in an operation where a data word and the associated check bits are read out of the storage, there has to be a comparison with the newly generated check bits, as described above. For that purpose a gating circuit 28 is provided through which either the check byte in the case of a read operation, or a byte consisting of zeros in the case of a read operation can be entered via bus 29 into the accumulation logic. In a serial read-out operation, such input is effected via shift register 26, bus 27, and gate 28.

As described above, accumulation logic 16 generates check bits C1-C8 in a write operation and syndrome bits S1-S8 in a read operation. The check bits reach the storage via bus 64. The respective data bits applied to bus 24 can reach storage 1 by bypassing the ECC device. For that purpose buses 24 and 64 are connected to bus 5 (FIG. 1).

In a read operation, the check byte from the storage is to be entered into the ECC device via bus 22, and the data bits either via line 23 or bus 24. For this process, the above-mentioned lines are to be connected also to bus 5 via suitable gates controlled by a read or write signal. For implementing the possible connections of FIG. 1 suitable gates between buses 5 and 6 on the one hand, and buses 22, 23, 24 and 64 on the other are therefore to be provided which are suitably controlled by read or write control signals.

Byte selection logic 10 of FIG. 2 consists of a series of multiplexors MPX1-MPX8. At a first clock time, each multiplexor passes on byte B0, at a second clock time byte B1, etc. up to byte B7, to bit selection logic 12. Logic 12 provides for each multiplexor a series of AND gates; e.g. eight AND gates 36, 37 . . . 38 are provided for multiplexor MPX1, AND gates 40, 41 . . . 42 for MPX2, and finally AND gates 44, 45 . . . 46 for MPX8. The first inputs of the AND gates are connected with one respective data bit output of the multiplexors. The respective second inputs of these AND gates are connected via a bus 34 to code implementing logic 20. Since there is a total of 64 AND gates 36–46, bus 34 is 64 bits wide. Code implementing logic 20 is structured in accordance with the matrix of FIG. 3. At the time when byte 0 is passed on by the eight multiplexors MPX1–MPX8 the above-mentioned AND gates therefore receive the following signals:

AND gates 36–38 connected to MPX1 are all switched through (enabled) at the second input in accordance with the first row, field "byte 0" of the matrix in FIG. 3. In accordance with the fourth row however all AND gates connected to MPX4 are switched. Of the AND gates connected to MPX5, those belonging to data bits D0, D4, D5 and D6 are switched. The switching of the AND gates connected to multiplexors 6 and 7 is given analogously in FIG. 3, rows 6 and 7 of fields "byte 0". Finally, of the AND gates (44, 45 . . . 46) connected to multiplexor 8 the AND gates belonging to data bits D3, D5, D6 and D7 are switched through.

In the next clock period, when byte 1 of the read-in data word is passed on by all multiplexors, AND gates 36–46 are switched in accordance with the data bits marked in the field "byte 1". For eight data bytes, the operation of the device is continued in the manner described, until byte 7 has been switched through bit selection logic 12.

The data bits passed on by AND gates 36–46 reach a respective byte parity generator BPG 1–BPG 8, with reference numbers 50, 52 and 54 being provided therefor in FIG. 4. Each BPG consists e.g. of a read-only storage with 256 inputs addressed by the data bits, and one single output. Since the binary data byte to which the parity bit is to be generated consists of a maximum of eight bits, 256 inputs are to be provided. On the other hand, generators 50, 52 and 54 have to supply one bit only, i.e. the parity bit, so that only one single output is to be provided.

The parity bit supplied by each generator BPG1–BPG8 reaches a modulo 2 adder circuit in accumulation logic 16. The modulo 2 adder circuit provided for each byte parity generator consists according to FIG. 4 of a flipflop LT1–LT8, and an associated Exclusive-OR gate 56, 57 . . . 58. The output of the flipflop is connected to one input of the Exclusive-OR gate, and the other input of this gate is connected to the output of the corresponding byte parity generator. The output of the Exclusive-OR gate is connected to the set input of flipflop LT. Owing to the accumulation of the parity bits received for the eight data bytes, check bits C1–C8 can be directly received after the eighth data byte at the output of each flipflop.

The above specification of the embodiment has shown that for generating each one of the eight check bits there is one respective set of functional units. Accordingly, the following is provided for the generation of check bit C1: Multiplexor MPX1; the series of AND gates 36, 37, 38; byte parity generator BPG1; Exclusive-OR gate 56, and flipflop 60. Referring to the first row of the matrix of FIG. 3 which is associated to multiplexor MPX1, bytes B0 to B7 consequently reach bit selection logic 12 via multiplexor MPX1. AND circuits 36 to 38 shown in this logic 12 permit the passing of those data bits only which in the first row of the matrix are marked with a dash. The binary signals reaching byte parity generator 50, and whose value for the non-switched AND gates is 0, and which for the data bits switched in accordance with a first row of the matrix of FIG. 3 assume the value of the switched data bits, are decoded as an address, and the bit at the respective address in generator 50 is read out to accumulation logic 16.

If the parity bit read out to the Exclusive-OR gate (e.g. 56) equals the bits contained in the flipflop (e.g. 60), two equal binary signals are applied at the input of gate 56 so that a zero is set in flipflop 60. If both inputs to gate 56 are non-equal, a One is set in flipflop 60. This operation corresponds to a modulo 2 addition.

For carrying out the comparison necessary in a read operation between a newly generated check bit and the check bit stored in storage 1, the read-out check bit is set in the flipflop via bus 22, gating circuit 28 and bus 29 at the beginning of the check bit operation. There consequently remains a zero in the flipflop if the newly generated check bit C1 equals the read-out check bit C. Otherwise, there remains a One in the flipflop. The bits which after the renewed check bit generation, i.e. after the comparison, remain in the flipflops and which as specified above are called "syndrome bits" (S1–S8) are read via a bus 64 into an error detecting and localizing logic 18. This logic 18 can also be designed as a read-only storage, the eight syndrome bits presenting 256 addresses, and e.g. 10 bits being stored at each address. The meaning of these bits is the following:

NE: All syndrome bits are zero, there is no error.
SE: A single error has been decoded. According to the code of FIG. 3, the single error is in a check bit if one single syndrome bit has the value One, and there is a single error among the data bits if three or five syndrome bits have the value One. Depending on which syndrome bits have the value One the position of the single error can be localized through decoding in logic 18.
DE: There is a double error which by using the code of FIG. 3 can be detected but not corrected. In the case of a double error, an even number (2, 4 or 6) of syndrome bits have the value One.

The remaining seven bits read out of logic 18 indicate the error location for the single error bit of a total of 72 bits.

The execution with respect to time in the production of the check and syndrome bits will now be described in detail with reference to FIGS. 5 and 6. FIG. 5 refers in particular to the generation of the first check or syndrome bit, C1 and S1, i.e. to the first row in the matrix of FIG. 3.

For generating check bit C1, the 64 data bits D0–D63 are applied at the input of the ECC device, and for the original setting of the flipflops LT1–LT8 a zero byte (8 zero bits) is applied, or the flipflops are reset. During clock T0, the zero'th level of the multiplexor MPX1 is switched, and at the output of the multiplexors data bits D0–D7 are thus available. The signals supplied by code implementing logic 20 to AND gates 36–38 consist of nothing but One's, according to the first row in FIG. 5. Accordingly, all eight data bits D0–D7 are applied to the input of parity generator BPG1, and the value of each individual data bit can of course be zero or One. At the output of generator 50 parity bit P0 is available, whereas at this time a zero still remains in flipflop LT1.

FIG. 5 in the next row represents the processes at clock time T1. The first level of the multiplexor is switched through, and the second data byte B1 with bits D8–D15 is passed on to the series of AND gates 36–38. According to the first row in FIG. 3, all these AND gates are switched through, and consequently all eight data bits D8–D15 are applied to the input of generator 50. At the output of the generator, parity bit P1 is obtained at this time, while in the meantime parity bit P0 had been added to the original zero in flipflop 60, so that the contents of LT1 now equal parity bit P0.

During the subsequent clock periods T2 to T7, one respective further level of multiplexor MPX1 is switched, and thus another data byte is passed on. The CRL switching signals generated according to the first row of the matrix of FIG. 3 by code implementing logic 20, for AND gates 36 to 38, as well as the data bits passed on accordingly to the input of generator 50 are given in the two corresponding fields of FIG. 5. The next column "LT1" of FIG. 5 indicates the modulo 2 added parity signals for the respective contents of flipflop LT1. In the last clock period T8, parity bit P7 generated in the preceding clock period T7 is added to the contents of flipflop 60, so that after the expiration of clock period T8, check bit C1 is contained in this flipflop.

In a read operation, the above described process is executed analogously, with the exception that prior to the starting of the parity bit accumulation, check bit C1' from the storage is set into the respective flipflop. For that purpose, the read-out check byte is read, via bus 22, gating circuit 28, and bus 29 into flipflops LT1–LT8 prior to the generation of the check bits. After the expiration of clock period T8 therefore the flipflop contains syndrome bit S1.

FIG. 6 once more clearly shows the bit selection signals generated by code implementing logic 20. The eight rows of FIG. 6 correspond to the eight clock periods T0–T7. One row of FIG. 6 therefore represents the binary signals supplied during the respective clock period by code implementing logic 20, for switching the AND gates of bit selection logic 12. Since in the given example eight data bytes have to be switched, logic 20 also has to generate 8×64 control bits for switching the AND gates. It is an essential feature of the present invention that the respectively used code has an effect only on code implementing logic 20 and on error detecting and localizing logic 18. Logic devices 18 and 20 can be advantageously designed as read-only storages (ROS, ROM, EAPROM, EAROM, PLA, etc.), these devices being initialized prior to the starting of the ECC device. All other devices of FIG. 4 do not depend on the code used, so that the device of FIG. 4 can easily be made in series production and, as described below, on one single semiconductor chip. If the maximum word width of eight data bytes is not required (lines 80, 82, FIG. 2) the number of clock signals is reduced accordingly (lines 86, FIG. 2). This means that not all levels of the multiplexors, not all AND gates of the bit selection logic, and not all sets of functional units according to FIG. 4 are used, since with a smaller number of data bits (lines 88, FIG. 2) the number of check bits can be smaller, too. The following practical values can e.g. be used:

1 data byte: 5 check bits
2 bytes: 6 check bits
4 bytes: 7 or 8 check bits
8 bytes: 8 check bits.

So the device specified in the embodiment of the present invention is applicable for up to a maximum of 64 data bits and eight additional check bits. The device can also be used for any smaller number of data or check bits by correspondingly reducing the clock periods, and by correspondingly not using logic circuits shown in FIG. 4, and non-required sets of functional units. The device as disclosed by the invention thus guarantees a maximum universal applicability with substantially standardized structure of the individual functional units.

The pins required for a semiconductor chip with the ECC device as disclosed by the invention comprise e.g. 101:

10 control connections for clock control 8 (FIG. 2), and for code implementing logic 20 (FIG. 2),
72 data input connections (buses 22 and 24),
1 serial data input 23,
8 check bit outputs (bus 64),
10 outputs of error detecting and localizing logic 18.

The above-mentioned number of 101 chip connections can be technologically realized.

With the integration densities realizable at present the housing of the device of FIG. 2 on one single semiconductor chip is no technological problem, either. Housing on one single chip is possible in the end through the byte-wise generation of check bits and syndrome bits, in accordance with the invention. This operation permits for many uses a particularly advantageous compromise between a fully serial mode which requires few circuits but is rather slow, and fully parallel operation requiring a great amount of hardware.

Therefore it should be understood that many modifications and changes can be made in the illustrated embodiments without departing from the spirit and scope of the invention as represented in the attached claims.

What we claim as new and desire to secure by Letters Patent is:

1. Generalized apparatus for generating check bits of an error correction code (ECC) protecting a data word comprising:

means for dividing the data word into successive data bytes,

N logic means each for combining in parallel any combination of the N bits in each successive byte to generate a partial sum of all ECC check bits for each successive byte, N program controlled gating means for selecting different combinations of bits out of the full data bytes to the N logic means, means for storing data for programming said N programmable gating means to each possible different combinations of bits for successive data bytes of the N logic means in accordance with the H matrix of the ECC code, means for modulo 2 summing all partial sums of each check bit to generate the check bit whereby the same apparatus may be used to generate check bits for a number of different combinations of data word lengths and ECC codes.

2. The apparatus, claimed in claim 1, wherein said programmable gating means, include separate means for simultaneous computation of all check bits.

3. The apparatus claimed in claim 1, wherein N program controlled gating means includes an AND circuit means controlled by said data for selecting data bits of a particular byte.

4. A device for single error correction and double error detection of a data word protected by check bits, with an arrangement for generating check bits for a data word in accordance with the code matrix of an error correcting code (ECC) with an arrangement indicating type and location of the error comprising:

a multiplexor means for the sequential arrangement of the individual data bytes of the data word, a programmed controlled gating circuit means for selecting any programmed combination of the data bits from the data bytes.

generator means to generate a partial sum of each check bit for each individual data byte using the data bits in each individual data byte selected by the programmed controlled gating circuit means, an adder for the modulo 2 summing of the partial sums of each check bit to generate that check bit, and a code implementing logic control means for controlling of the gating circuit means of the individual check bytes in accordance with the H matrix of the ECC code used.

5. Device as claimed in claim 4, wherein the code implementing logic control means is a read-only storage connected by a bus to the gating circuit means for selecting the individual check bits.

6. Device as claimed in claim 4, wherein the gating circuit means comprises a series of AND gates each gate selecting or deselecting one bit of the byte in response to a single bit from the code implementing logic control means.

7. Device as claimed in claim 4, including a clock control means for receiving control signals for defining the data word width aid in response thereto supplying a number of clock pulses corresponding to the number of bytes of a data word for controlling said multiplexor means so that only those portions of a multiplexor means are enabled to which data bytes are applied.

8. Device as claimed in claim 6 wherein in that the code implementing logic includes means for receiving control signals for defining the number of bits per data byte, and in response thereto providing to the AND gates a number of gate control signals per clock period corresponding to this bit number so that only those AND gates of a series are enabled to which data bits are applied.

9. Device as claimed in claim 4, wherein said adders belonging to the individual check bits each comprise a flipflop with an Exclusive-OR gate in its feedback path with inputs of all flipflops connected to a common bus.

10. Device as claimed in claim 9, including storage means for storing together data words and generated check bits for the storage words.

11. Device as claimed in claim 10, wherein the outputs of all said flipflops are connected by a common bus to an error detecting and localizing logic in read-only storage form.

12. Device as claimed in claims 5 and 11, wherein the code implementing logic and the error detecting and localizing logic are personalizable semiconductor storages.

* * * * *